United States Patent
Chen et al.

(10) Patent No.: US 11,506,714 B2
(45) Date of Patent: Nov. 22, 2022

(54) SETUP TIME AND HOLD TIME DETECTION SYSTEM AND DETECTION METHOD

(71) Applicant: DigWise Technology Corporation, LTD, Hsinchu County (TW)

(72) Inventors: Shih-Hao Chen, Hsinchu County (TW); Chih-Wen Yang, Hsinchu County (TW)

(73) Assignee: DigWise Technology Corporation, LTD, Hsinchu County (TW)

(*) Notice: Subject to any disclaimer, the term of this patent is extended or adjusted under 35 U.S.C. 154(b) by 0 days.

(21) Appl. No.: 17/448,703

(22) Filed: Sep. 23, 2021

(65) Prior Publication Data

US 2022/0326304 A1 Oct. 13, 2022

(30) Foreign Application Priority Data

Apr. 12, 2021 (TW) ................................ 110113138

(51) Int. Cl.
G01R 31/3193 (2006.01)
H01L 21/66 (2006.01)

(52) U.S. Cl.
CPC ........ *G01R 31/31937* (2013.01); *H01L 22/14* (2013.01)

(58) Field of Classification Search
None
See application file for complete search history.

(56) References Cited

U.S. PATENT DOCUMENTS

| | | |
|---|---|---|
| 2011/0004813 A1 | 1/2011 | Chandra |
| 2013/0086444 A1 | 4/2013 | Liu |
| 2017/0194060 A1 | 7/2017 | Kim et al. |
| 2019/0033372 A1 | 1/2019 | Gohel et al. |

FOREIGN PATENT DOCUMENTS

| | | |
|---|---|---|
| CN | 1329254 A | 1/2002 |
| CN | 107942280 A | 4/2018 |
| CN | 109150175 A | 1/2019 |
| TW | 201245732 A | 11/2012 |
| TW | I477946 B | 3/2015 |
| TW | 201525497 A | 7/2015 |
| TW | 201743069 A | 12/2017 |
| TW | 201838052 A | 10/2018 |

*Primary Examiner* — Guerrier Merant
(74) *Attorney, Agent, or Firm* — CKC & Partners Co., LLC

(57) ABSTRACT

A setup time and hold time detection system including a monitoring unit and a processing unit. The monitoring unit is configured to detect multiple setup times and multiple hold times of multiple test circuits through a source clock signal. The processing unit is configured to record multiple setup times and multiple hold times as multiple detection data. The processing unit is further configured to select a first part of the detection data as multiple first detection data to establish an estimation model. The processing unit is further configured to select a second part of the detection data as multiple second detection data, and compare the second detection data and multiple estimation results generated by the estimation model to obtain an error value of the estimation model.

20 Claims, 13 Drawing Sheets

SETUP TIME AND HOLD TIME DETECTION SYSTEM AND DETECTION METHOD

CROSS-REFERENCE TO RELATED APPLICATION

This application claims priority to Taiwan Application Serial Number 110113138, filed Apr. 12, 2021, which is herein incorporated by reference in its entirety.

BACKGROUND

Technical Field

The present disclosure relates to a setup time and hold time detection system and detection method, especially used to detect the setup time and hold time of a circuit during signal transmission.

Description of Related Art

With the development of microelectronics technology, the volume of various semiconductor elements is designed to become smaller and smaller. In contrast, semiconductor elements are also more sensitive to voltage and temperature. Therefore, in order to ensure the defect rate and performance of the semiconductor product, semiconductor elements must be tested, especially for the timing errors of semiconductor elements.

SUMMARY

One aspect of the present disclosure is a setup time and hold time detection system, comprising a monitoring unit and a processing unit. The monitoring unit is electrically coupled to a plurality of test circuits, and is configured to detect a plurality of setup times and a plurality of hold times of the plurality of test circuits during signal transmission according to a source clock signal. The processing unit is electrically coupled the monitoring unit, and is configured to receive the plurality of setup times and the plurality of hold times. The processing unit is configured to record the plurality of setup times and the plurality of hold times as a plurality of detection data of the plurality of test circuits. The processing unit cormprises a data module circuit and a data detection circuit. The data module circuit is configured to select a first part of the detection data as a plurality of first detection data to establish an estimation model. The estimation model is configured to estimate a signal transmission status of the plurality of test circuits under different conditions. The data detection circuit is configured to select a second part of the detection data as a plurality of second detection data. The plurality of second detection data are different from the plurality of first detection data, and are configured to compare with a plurality of estimation results generated by the estimation model to obtain an error value of the estimation model.

Another aspect of the present disclosure is a setup time and hold time detection method, comprising the following steps: detecting, by a monitoring unit, a plurality of setup times of a plurality of test circuits and a plurality of hold times of the plurality of test circuits during signal transmission; recording the plurality of setup times and the plurality of hold times as a plurality of detection data of the plurality of test circuits; selecting a first part of the detection data as a plurality of first detection data, and establishing an estimation model according to the plurality of first detection data; selecting a second part of the detection data as a plurality of second detection data, wherein the plurality of second detection data are different from the plurality of first detection data; and comparing the plurality of second detection data with a plurality of estimation results generated by the estimation model to obtain an error value of the estimation model.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

The present disclosure relates to a setup time and hold time detection system and method applied in a test device, so as to detect operation status or operation parameters of the semiconductor elements in the test device during signal transmission. The semiconductor elements can be a die on a wafer or a packaged chip. In some embodiments, the detection system is configured to perform a "functional parameter test" (or a dynamic function test) to detect the error of time sequence of each semiconductor element, but the present disclosure is not limited to this.

Generally speaking, the test device has a huge number of the semiconductor elements to perform different logical operations. Since the configuration conditions of each the semiconductor elements are different, when the test device is operating, the operation status of each the semiconductor elements can not maintain within the ideal range. Therefore, it is necessary to confirm the true state of the semiconductor elements through detection to adjust or improve the manufacturing process. The above "configuration conditions" include the structural characteristics, the arrang position, the ambient temperature or the stability of the power supply of the semiconductor elements, etc. For example, in the case of miniaturization of the test device, the width of the wire is compressed, resulting in an increase in resistance, so that the semiconductor elements will have an additional "IR drop (i.e., voltage drop)" that does not exist in an ideal state. The size or magnitude of IR drop is related to a distance between the semiconductor elements and the I/O Pad of the test device. Similarly, the characteristics of voltage, current, temperature, etc. may also change, causing errors in the signal transmission of the semiconductor elements.

Figure 1A:
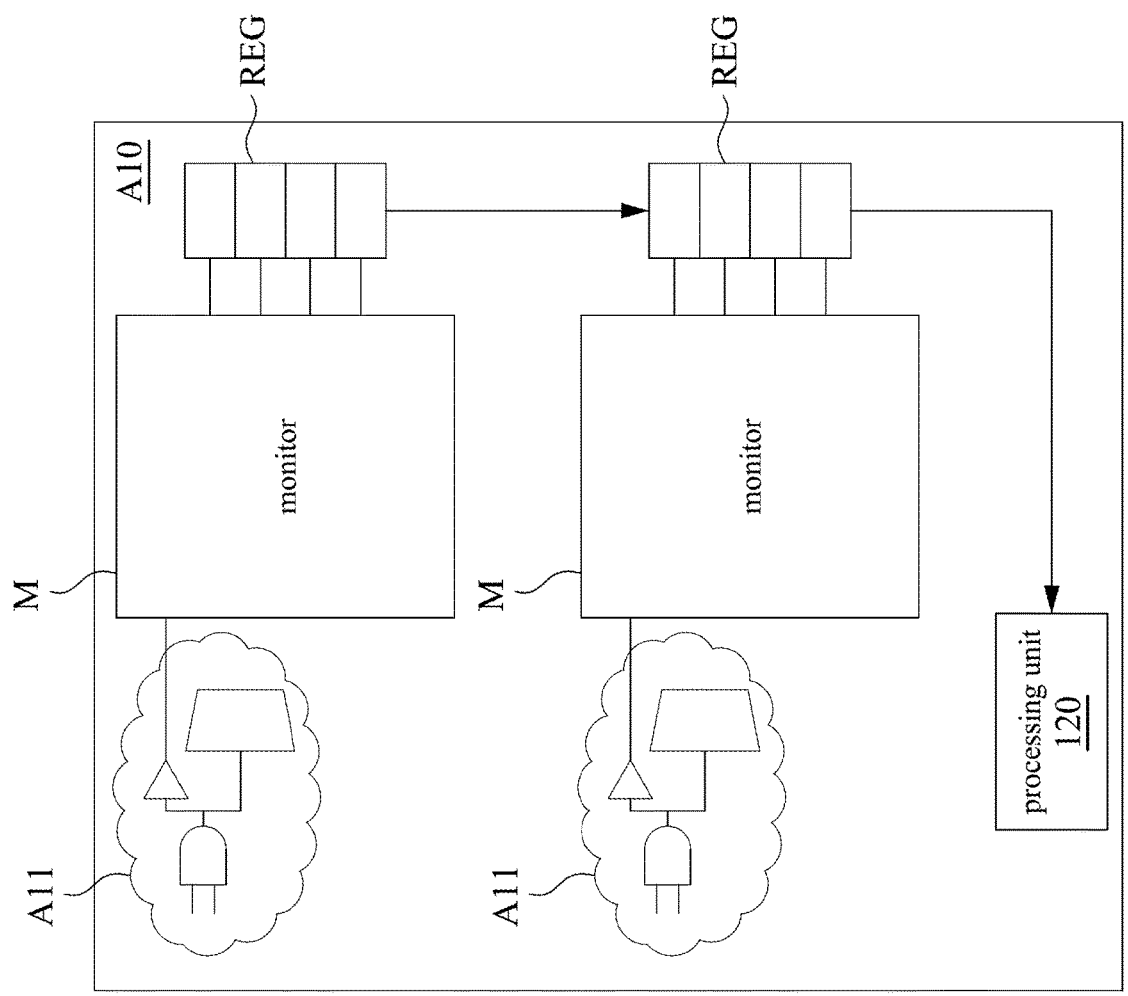
FIG. 1A is a schematic diagram of the detection system and the test circuits in some embodiments of the present disclosure.

The detection system 100 includes multiple the monitors M and a processing unit 120. FIG. 1A is a schematic diagram of the detection system and the test circuits in some embodiments of the present disclosure. In some embodiments, the monitors M are arranged in the test device A10, and each of monitors M is electrically coupled to one test circuits A11 in the test device A10.

In this embodiment, the test circuits A11 can be the semiconductor elements discussed above. FIG. 1A is a schematic diagram of the relative position between the monitors M and the test circuits A11, the internal circuit and detection methods will be detailed in following paragraphs.

The processing unit 120 is electrically coupled to registers REG of the test device A10. During detecting, the test circuits A11 operates according to a test sample signal input from external device (i.e., Pattern provided by the processing unit 120), and stores the operated signal to the register REG by the monitor M. Accordingly, when the test device A10 performing various operations, the monitor M may detect the operation status and data of the corresponding test circuits A11, and transmits the detection result to the processing unit 120 by the registers REG.

Figure 1B:
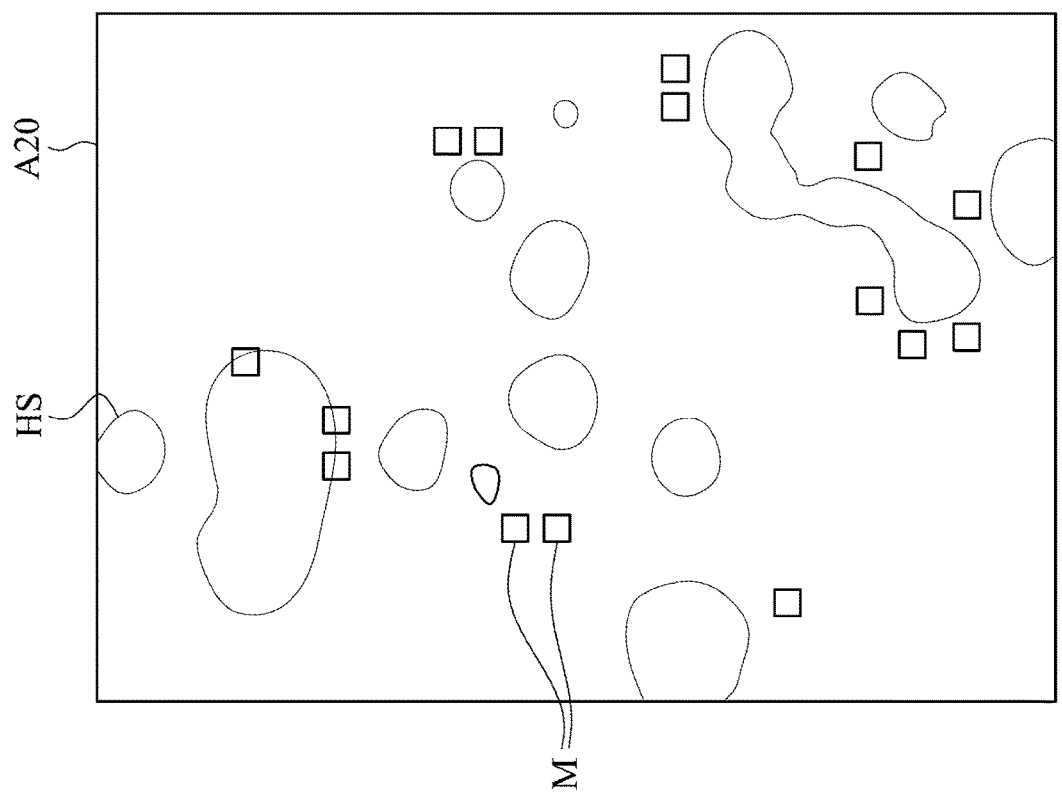
FIG. 1B is a schematic diagram of the test chip in some embodiments of the present disclosure.

FIG. 1B is a schematic diagram of the processing chip A20 to be tested in the test device A10 in some embodiments of the present disclosure. The processing chip A20 includes multiple circuits, and the processing chip A20 has multiple areas with higher temperature during operation, which are called hot spots hit spots HS. The circuit in the hot spot HS or the area adjacent to the hot spot HS is called the critical path or sub-critical path. In some embodiments, the circuit on the critical path or the sub-critical path is taken as the test circuits A11, but the present disclosure is not limited to this.

Figure 1C:
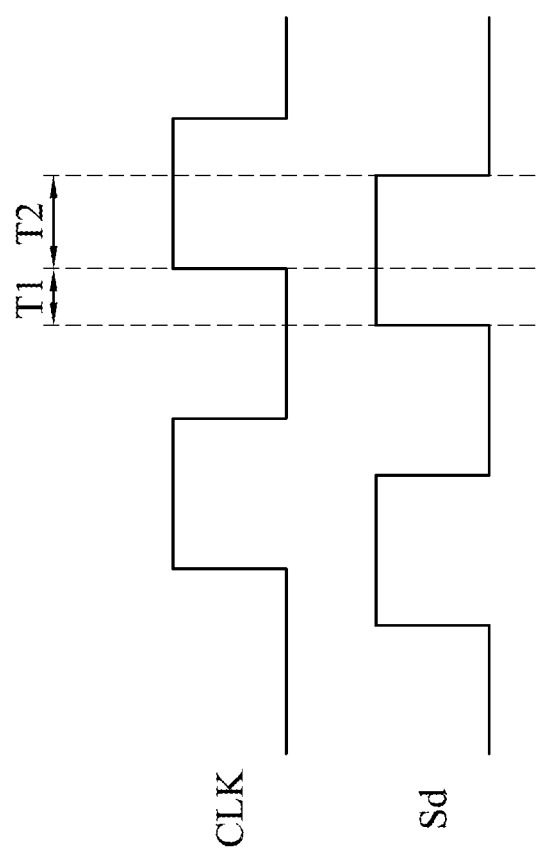
FIG. 1C is a time sequence of the signal in some embodiments of the present disclosure.

In one embodiment, the monitor M is configured to detect "the error of the time sequence" of the test circuits A11. The error of the time sequence means the relative relationship between the transmission time of a data signal and a source clock signal when the test circuits A11 transmits the data dignal according to the source clock signal. The error of the time sequence includes a setup time and a hold time. FIG. 1C is a time sequence of the signal in some embodiments of the present disclosure. The source clock signal CLK is configured to trigger the test circuits A11 operateing (e.g., input or output). The original data signal Sd is data/information that need to transmit to the test circuits A11.

As mentioned above, "the setup time" is a time length that the original data signal Sd arrives in advance before the positive edge or the negative edge of the source clock signal CLK is arrived. "The hold time" is a time length that the original data signal Sd maintains stable after the positive edge or the negative edge of the source clock signal CLK is arrived. For example, if the test circuits A11 is triggered according to the positive edge (0 to 1) or the negative edge source clock signal (1 to 0) of the source clock signal CLK level change, the setup time T1 is the time length that the original data signal is earlier than the ideal trigger time, and the hold time T2 is the time length of time the original data signal continues to maintain the same data after the ideal trigger time.

Figure 2:
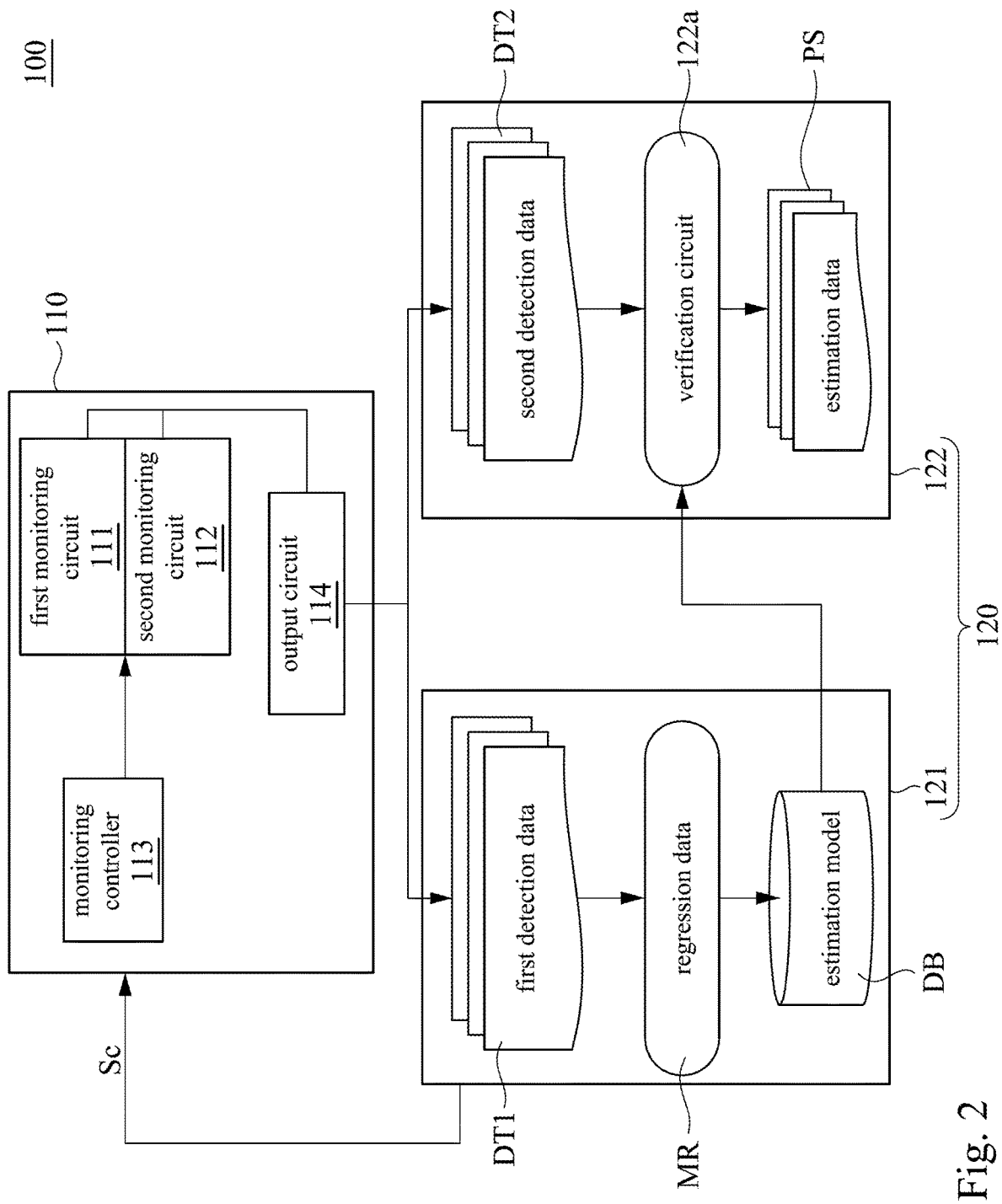
FIG. 2 is a schematic diagram of the detection system in some embodiments of the present disclosure.

FIG. 2 is a schematic diagram of the detection system in some embodiments of the present disclosure. The detection system 100 includes a monitoring unit 110 and a processing unit 120. The monitoring unit 110 has multiple monitors M (as shown in FIG. 1A), which are electrically coupled to the test circuits A11 arranged on the different positions, so as to detect the setup times and the hold times of the corresponding test circuits A11 through the source clock signal during signal transmission.

In some embodiments, the monitoring unit 110 further includes a monitoring controller 113 and an output circuit 114, and the monitor M can be classified into a first monitoring circuit 111 and a second monitoring circuit 112 according to the detect target. The first monitoring circuit 111 is configured to detect the setup times, and the second monitoring circuit 112 is configured to detect the hold times. The monitoring controller 113 is electrically coupled to everyone of the first monitoring circuit 111 and the second monitoring circuit 112, so as to selectively detect the setup times or the hold times. The detection result of the first monitoring circuit 111 and the second monitoring circuit 112 will be transmit to the output circuit 114, and back to the processing unit 120.

Figure 3B:
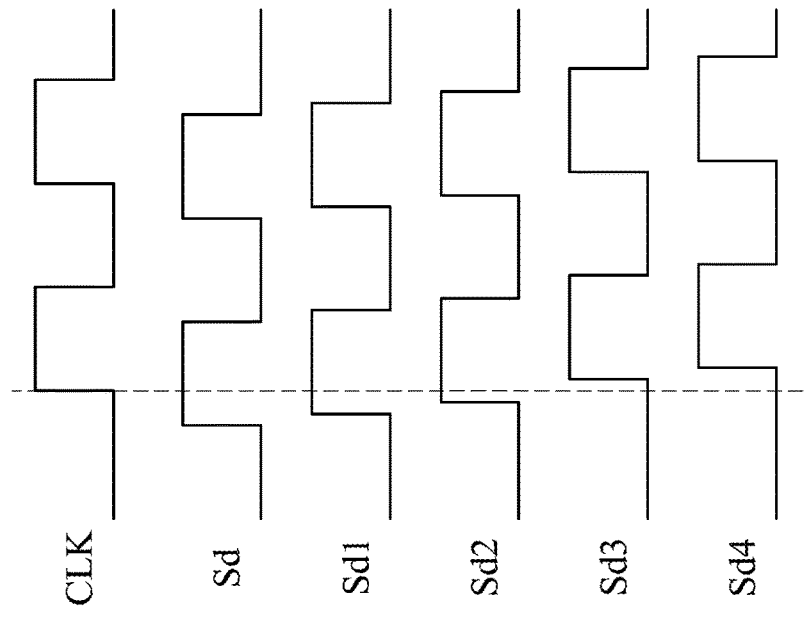
FIG. 3B is a schematic diagram of the setup time in some embodiments of the present disclosure.
Figure 3A:
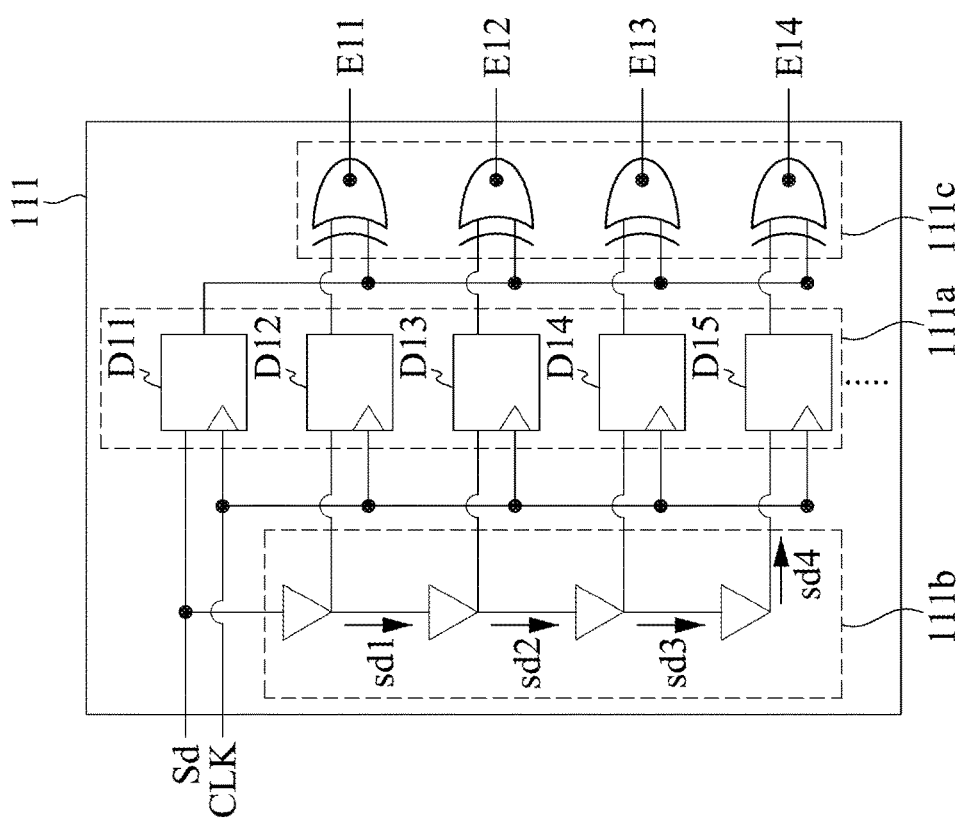
FIG. 3A is a schematic diagram of the first monitoring circuit in some embodiments of the present disclosure.

FIG. 3A is a schematic diagram of the first monitoring circuit 111 corresponding to one of the test circuits A11 in some embodiments of the present disclosure. The first monitoring circuit 111 includes a first register circuit 111$a$, a first delay circuit 111$b$ and a first logic circuit 111$c$. The first register circuit 111$a$ is configured to receive an original data signal Sd, and output the original data signal Sd according to the source clock signal CLK. As shown in figure, in one embodiment, the first register circuit 111$a$ includes multiple registers D11-D15 (e.g., D type flip-flop). Registers are triggered in response to the positive edge or the negative edge of the source clock signal CLK, and are output the received original data signal Sd.

The first delay circuit 111*b* is electrically coupled to the first register circuit 111*a*. The first delay circuit 111*b* is configured to delay the original data signal Sd. For clarity, signals, which are generated from the first delay circuit 111*b* by delaying the original data signal Sd, are referred to as "the delayed data signals Sd1-Sd4". The first delay circuit 111*b* transmits the delayed data signals Sd1-Sd4 to the first register circuit 111*a*, so that the first register circuit 111*a* outputs the delayed data signals Sd1-Sd4 according to the source clock signal CLK.

Specifically, the first delay circuit 111*b* includes multiple delay elements. The delay elements is electrically between the input terminal of the first monitoring circuit 111 and the registers D11-D15 of the first register circuit 111*a* in series. Each of the delay elements is configured to delay the received signal for the same period of time (e.g., 10 picoseconds) to form the delayed data signals Sd1-Sd4. As shown in figure, the registers D11-D15 of the first register circuit 111*a* receives the original data signal Sd and the delayed data signals Sd1-Sd4. Accordingly, each signal output by each of the registers D11-D15 will corresponse to the data (level) of the original data signal Sd when directly inputing to the the first monitoring circuit 111, when delaying 10 picoseconds, when delaying 20 picoseconds, when delaying 30 picoseconds, and when delaying 40 picoseconds. The numbers of registers and delay elements can be adjusted according to the test requirements, and is not limited to the one drawn in FIG. 3A.

The first logic circuit 111*c* is electrically coupled to the first register circuit 111*a*, and is configured to receive the original data signal Sd and the delayed data signals Sd1-Sd4 output by the first register circuit 111*a*. The first logic circuit 111*c* is configured to compare the difference between each of the delayed data signals Sd1-Sd4 and the original data signal Sd.

In some embodiments, the first logic circuit 111*c* includes multiple XOR gates. Each of XOR gates receive the original data signal Sd and one of the delayed data signals Sd1-Sd4. The output terminal of the XOR gates is electrically to multiple output terminals E11-E14 of the first logic circuit 111*c*.

When the signals of the two input terminals of the XOR gates are the same, the output signal is high level "1". On the other hand, when the signals of the two input terminals of the XOR gates are different, the output signal is low level "0". Accordingly, the setup time of the test circuit A11 can be obtained according to the signals output by the output terminals E11-E14. In other words, the first logic circuit 111*c* compares the data of the original data signal Sd at different times before the signal edge (the positive edge or the negative edge) is delivered.

FIG. 3B is a schematic diagram of the setup time in some embodiments of the present disclosure. The signal levels output by the registers D11-D15 are "1, 1, 1, 0, 0". The signal levels output from the first logic circuit 111*c* to the output terminals E11-E14 are "1, 1, 0, 0" ". It represents the setup time of the corresponding test circuit A11 is between 20-30 picoseconds. In some other embodiments, the first logic circuit 111*c* can also receive the signal output by the first register circuit 111*a* through a plurality of XNOR gates.

Figure 3D:
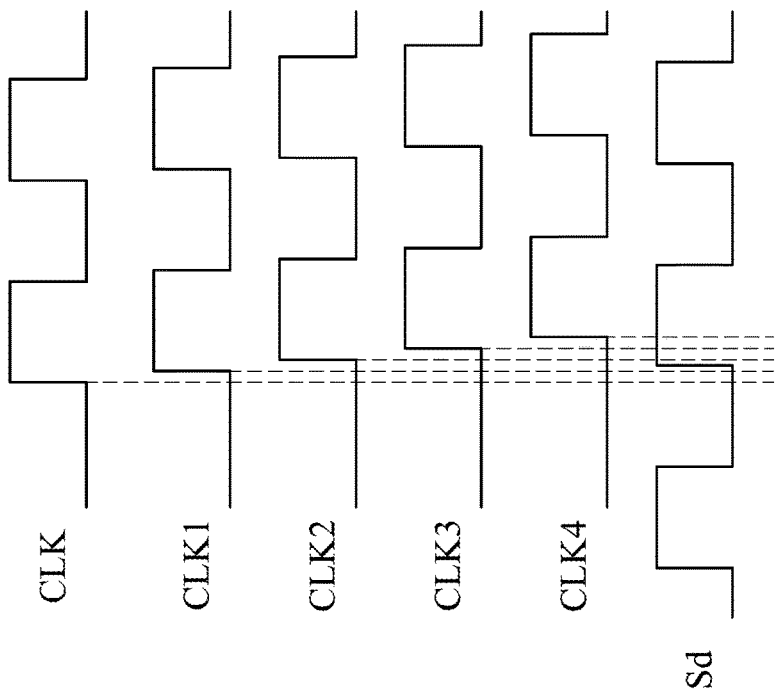
FIG. 3D is a schematic diagram of the hold time in some embodiments of the present disclosure.
Figure 3C:
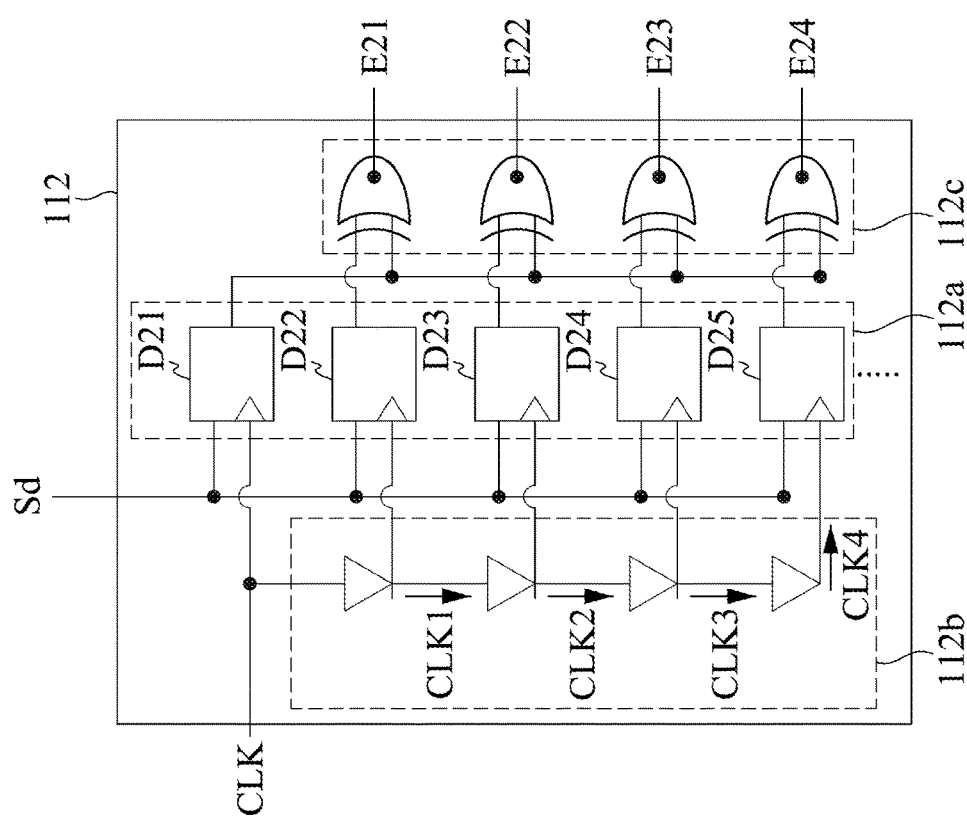
FIG. 3C is a schematic diagram of the second monitoring circuit in some embodiments of the present disclosure.

FIG. 3C is a schematic diagram of the second monitoring circuit in some embodiments of the present disclosure. The second monitoring circuit 112 includes a second register circuit 112*a*, a second delay circuit 112*b* and a second logic circuit 112*c*. The second register circuit 112*a* is configured to receive the original data signal Sd, and output the original data signal Sd according to the source clock signal CLK. The second register circuit 112*a* includes multiple registers D21-D25. For clarity, the time when the second monitoring circuit 112 receives the source clock signal CLK is referred to as the original time. The second delay circuit 112*b* is electrically coupled to the second register circuit 112*a*, and is configured to delay the source clock signal CLK to generate the delayed clock signals CLK1-CLK4.

Specifically, the second delay circuit 112*b* includes multiple delay elements. The delay elements are electrically coupled between the input terminal of the second monitoring circuit 112 and input terminals of the registers D21-D25 of the second register circuit 112*a* in series. Each of the delay elements delays the receive clock signal CLK the same period of time (e.g., 10 picoseconds) to form the delayed clock signals CLK1-CLK4. The second delay circuit 112*b* transmits the delayed clock signals CLK1-CLK4 to the second register circuit 112*a*, so that the second register circuit 112*a* outputs the original data signal Sd to the corresponding delayed time according to the delayed clock signals CLK1-CLK4. In other words, the second register circuit 112*a* sequentially outputs the original data signal Sd at the original time, at 10 picoseconds delayed, at 20 picoseconds delayed, at 30 picoseconds delayed and at 40 picoseconds delayed, respectively. The type and number of the delay elements of registers can be adjusted according to test requirements, and are not limited to those drawn in FIG. 3C.

The second logic circuit 112*c* is electrically coupled to the second register circuit 112*a*, and is configured to receive the original data signal Sd output by the second register circuit 112*a*. Since the registers D21-D25 of the second register circuit 112*a* outputs the original data signal Sd at different time according to the source clock signal CLK and the delayed clock signals CLK1-CLK4, the second logic circuit 112*c* receives the signal levels of the original data signal Sd at different time, and is configured to compare the difference of the signal levels between the original data signal Sd received at the original time and at the delayed time.

In some embodiments, the second logic circuit 112*c* includes multiple XOR gates. Each of the XOR gates receives the original data signal Sd output by the second register circuit 112*a*. The output terminal of the XOR gates are respectively coupled to multiple output terminals E21-E24 of the second logic circuit 112*c*. In other words, the second monitoring circuit 112 is configured to detect the signal level of the original data Sd when triggering by the source clock signal CLK and delayed clock signal CLK1-CLK4. Accordingly, the hold time of the test circuits A11 can be obtained by the signals output by the output terminals E21-E24.

FIG. 3D is a schematic diagram of the hold time detected by the second monitoring circuit 112 in some embodiments of the present disclosure. The signal levels output by the registers D21-D25 are "1, 1, 0, 0, 0". The signal levels output from the second logic circuit 112*c* th the output terminals E11-E14 are "1, 0, 0, 0", it respresents that the hold time of the test circuits A11 is between 10-20 picoseconds. In some other embodiments, the first logic circuit 111*c* or the second logic circuit 112*c* may receive signals by multiple XNOR gates.

Figure 3E:
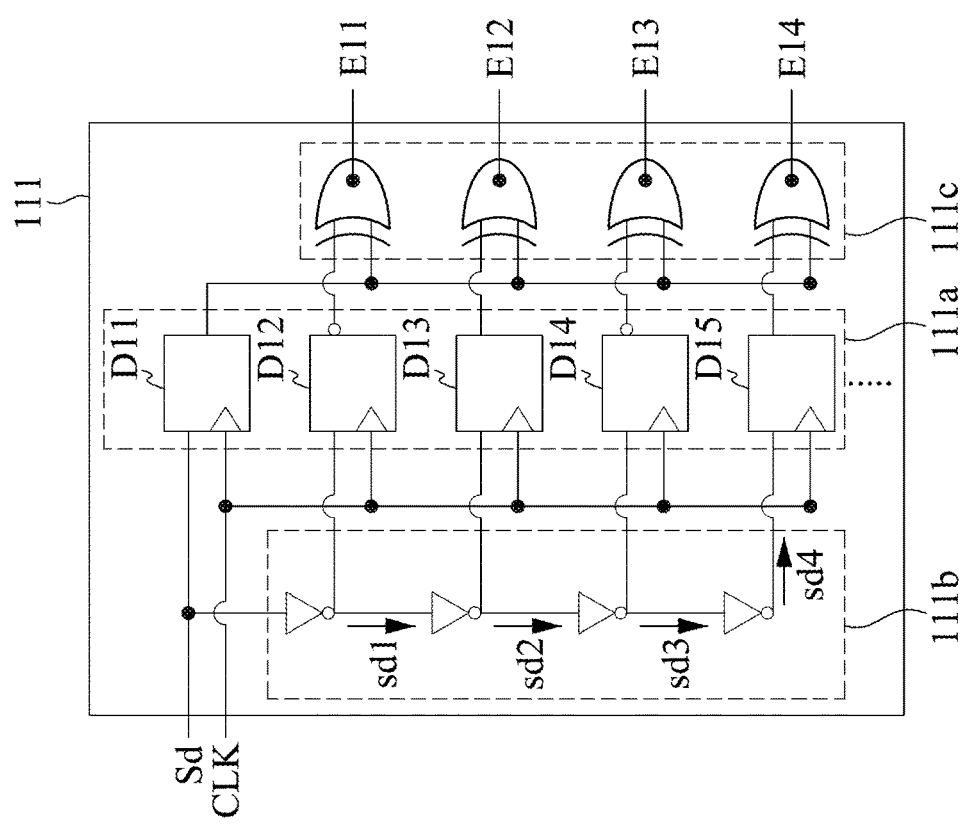
FIG. 3E is a schematic diagram of the first monitoring circuit in some embodiments of the present disclosure.

FIG. 3E is a schematic diagram of the first monitoring circuit 111 in some embodiments of the present disclosure. In FIG. 3E, the similar components associated with the embodiment of FIG. 3A are labeled with the same numerals for ease of understanding. The specific principle of the similar component has been explained in detail in the previous paragraphs, and unless it has a cooperative relationship with the components of FIG. 3E, it is not repeated here. In one embodiment, multiple delay elements of the first delay circuit 111b can be implemented by inverters, and the registers D12, D14 also have inverted output terminals correspondingly. In some embodiments, the circuit implemented by inverters can be simplified.

As shown in embodiments in FIG. 3A and FIG. 3C, both of monitoring circuits 111/112 "delay" the original data signal Sd to receive the signal levels of the original data signal Sd at different time. In other embodiments, the monitoring circuit can also use the same principle to compare the signal levels of the original data signal Sd at different time by "timing boost" method. In other words, the monitoring unit 110 can adjust (e.g., delay or advance) the transmission time of the original data signal Sd to detect the setup time and the hold time of the test circuit during signal transmission.

Figure 3G:
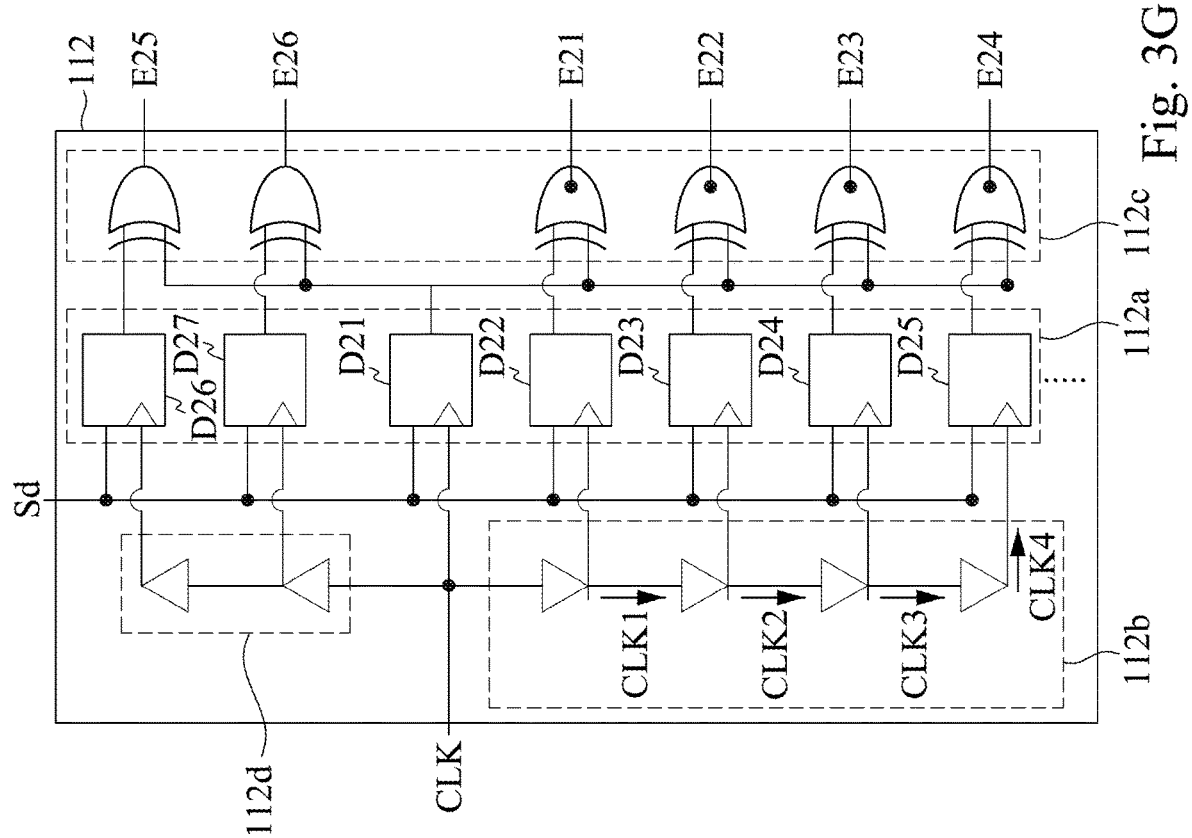
FIG. 3G is a schematic diagram of the second monitoring circuit in some embodiments of the present disclosure.
Figure 3F:
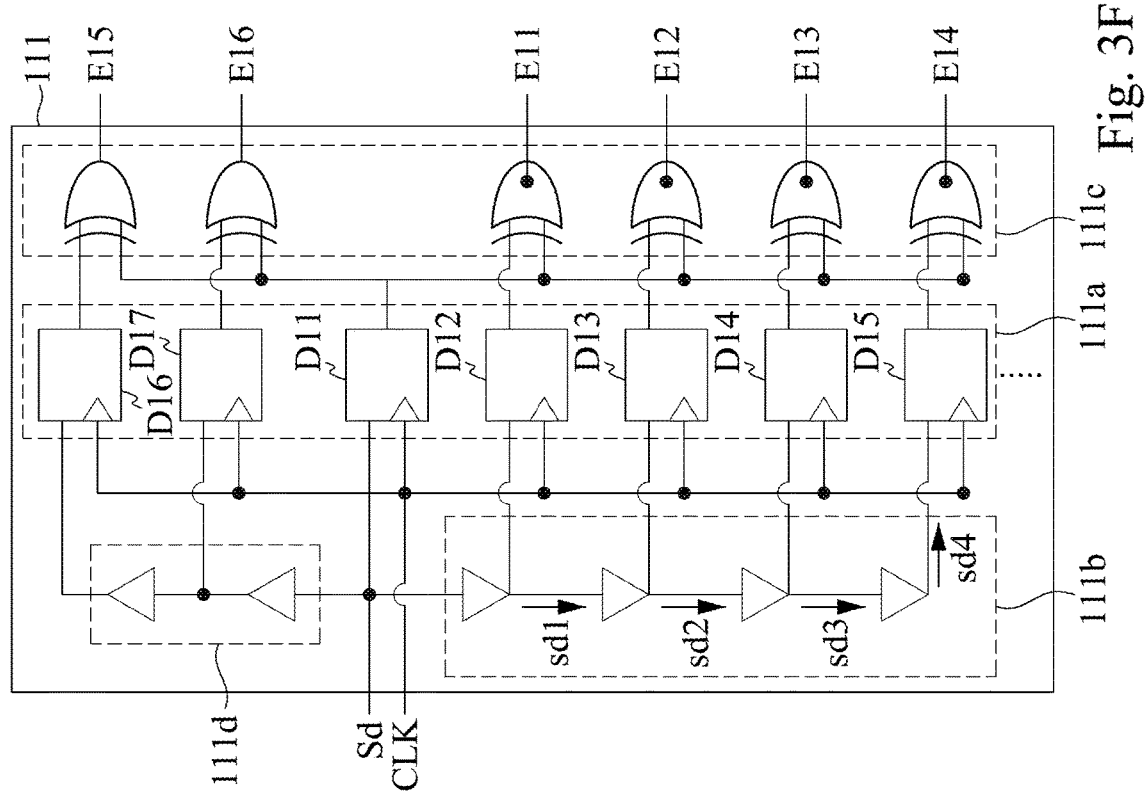
FIG. 3F is a schematic diagram of the first monitoring circuit in some embodiments of the present disclosure.

FIG. 3F is a schematic diagram of the first monitoring circuit 111 in some embodiments of the present disclosure. FIG. 3G is a schematic diagram of the second monitoring circuit 112 in some embodiments of the present disclosure. In FIG. 3F and FIG. 3G, the similar components associated with the embodiment of FIG. 3A and FIG. 3C are labeled with the same numerals for ease of understanding. The specific principle of the similar component has been explained in detail in the previous paragraphs, and unless it has a cooperative relationship with the components of FIG. 3F and FIG. 3G, it is not repeated here.

As shown in FIG. 3F, the first monitoring circuit 111 further includes a first timing boost circuit 111d. The first timing boost circuit 111d is electrically coupled to the first register circuit 111a, and is configured to transmit the original data signal Sd to the first register circuit 111a in advance (e.g., 10 picoseconds earlier than the source clock signal). The first register circuit 111a will also receive the original the original data signal Sd and the original data signal Sd transmitted in advance through multiple registers D11-D17, and output to the multiple output terminals E11-E16 of the first logic circuit 111c.

Similarly, the second monitoring circuit 112 further includes a second timing boost circuit 112d. The second timing boost circuit 112d is electrically coupled to the second register circuit 112a, and is configured to transmit the original data signal Sd to the second register circuit 112a in advance (e.g., 10 picoseconds earlier than the source clock signal). The second register circuit 112a will also receive the original the original data signal Sd and the original data signal Sd transmitted in advance through multiple registers D21-D27, and output to the multiple output terminals E21-E26 of the second logic circuit 112c.

As shown in FIG. 2, the processing unit 120 is electrically coupled to the monitoring unit 110, so as to receive the setup time and the hold time back from the monitoring unit 110. The processing unit 120 records each of the setup time and the hold time as a detection data corresponding to one of the test circuits A11. In other words, the processing unit 120 establishes multiple detection data corresponding to the test circuits A11. As shown in FIG. 1A, each the detection data is configured to record the error value of the time sequence (i.e., the setup time, the hold time) of the same test circuits A11.

The processing unit 120 includes a data module circuit 121 and a data detection circuit 122. The data module circuit 121 selects a first part of the detection data (randomly select 5% of the detection data), as the first detection data DT1.

Then, the data module circuit 121 generates regression data MR (Mathematic Regression, such as a set of mathematical polynomials) according to the first detection data DT1, and then establishes a estimation model DB. The estimation model DB is configured to estimate a signal transmission status of any one of the test circuits under different configuration conditions. The above "configuration conditions" includes the arrang position, the power supply, the logical actions during the test of the test circuits A11. The signal transmission status can include the setup time and the hold time. In other words, the estimation model DB is configured to use various configuration conditions as input parameters to estimate the error value of time sequence of the test circuits A11 during operation.

The data detection circuit 122 selects a second part of the detection data (other 95% of the detection data), as multiple second detection data DT2. The second detection data DT2 is different from the first detection data DT1 (but can be partially the same), and is configured to be compared with the estimation results generated by the estimation model DB to obtain the error value of the estimation model. In some embodiments, the estimation model DB is configured to estimate the signal transmission status of the non-critical circuit on the non-critical path of the test chip A20 (as shown in FIG. 1B).

In some embodiments, the data detection circuit 122 includes a verification circuit 122a, and is configured to compare multiple estimation results of the estimation model DB with the second detection data DT2. For example, the verification circuit 122a takes the configuration conditions of the second detection data DT2 as input parameters, and feed it into the estimation model DB to obtain the estimation results (e.g., an estimated setup time and an estimated the hold time). Then, the verification circuit 122a compares the estimation results of the estimation model DB with the setup time and the hold time recorded in the second detection data to obtain the error value of the estimation model DB.

If the error value less than the threshold value (or a predetermine range), the data detection circuit 122 will generate an estimation data (estimation sample) of the test circuits according to the estimation model DB. The estimation data can be the performance of the test circuits under various conditions, and can be expressed in the form of curves, medians, averages, tables or characteristic expressions.

Therefore, by establishing the estimation model DB, the detection system 100 can obtain the estimation data of the test circuits A11 under different configuration conditions for reference, and the estimation data can be used to adjust the manufacturing process of the semiconductor elements. Since the detection system 100 establish the estimation model DB according to a part of the detection data (the first detection data), and performs verification and confirmation according to the other part of the detection data (the second detection data) after establishing the estimation model DB, the computational complexity of the processing unit 120 can be reduced under the condition of ensuring the accuracy of the model.

In some embodiments, if the error value larger than the threshold value (or the predetermine range) after obtaining the error value, such a larger than 5%, the processing unit 120 will adjust or rebuild the estimation model DB according to the detection data. The processing unit 120 selects a third part of the detection data, and adjusts the estimation model DB (e.g., the third part is different from the first detection data and the second detection data, or a part of the second detection data is added to the first detection data to form the third part).

In addition, in some embodiments, when the processing unit 120 receives the setup time and the hold time from the monitoring unit 110, the processing unit 120 also records the configuration parameters of the test circuits A11 (i.e., the corresponding control parameters of the above configuration conditions). The processing unit 120 stores the setup time corresponding to the test circuits, the hold time corresponding to the test circuits and the configuration parameters corresponding to the test circuits as the same detection data. Therefore, when verifying the error value of the estimation model DB, the configuration parameters can be used as the input parameters of the estimation model DB.

Figure 4A:
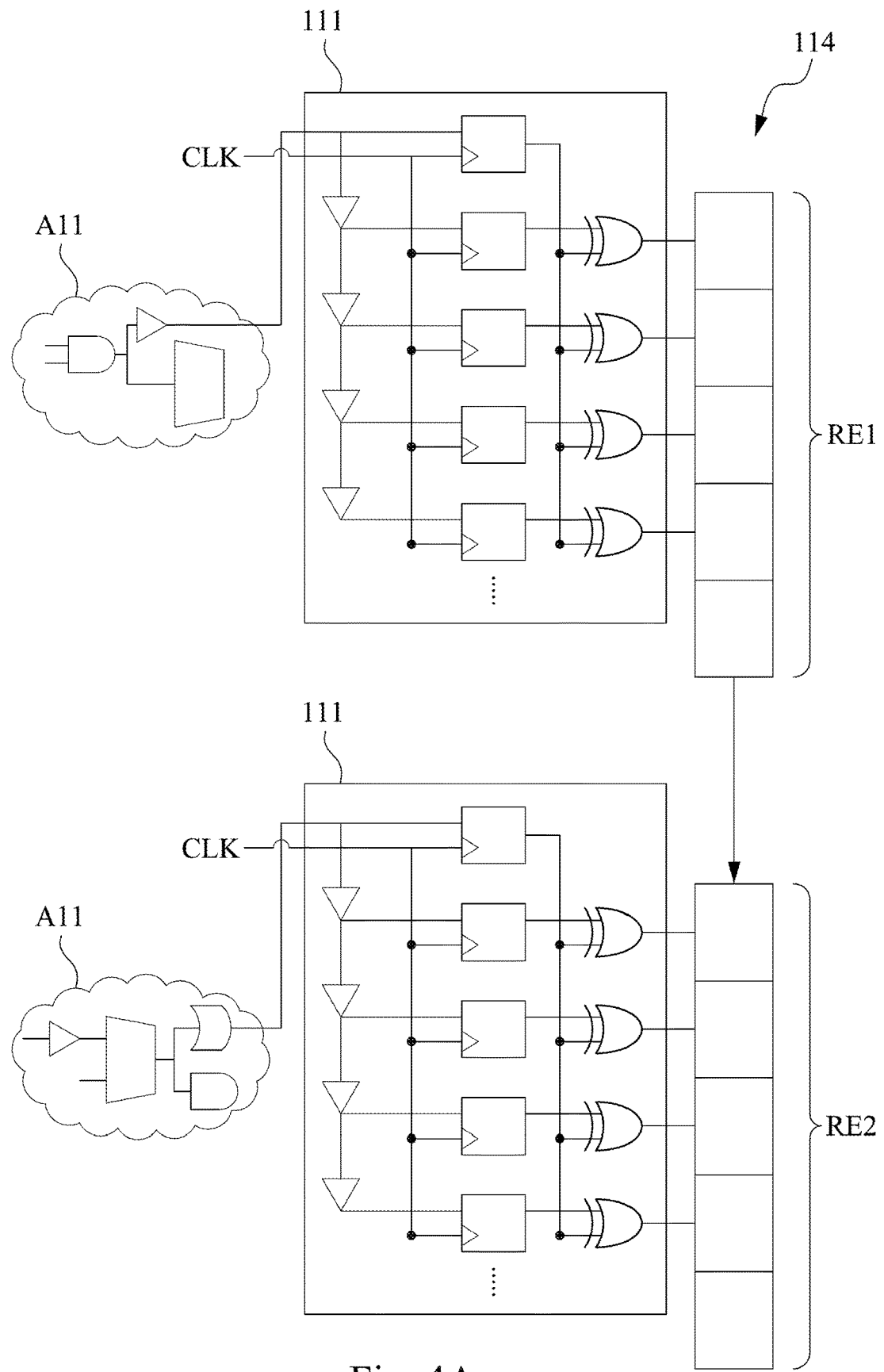
FIG. 4A is a schematic diagram of the first monitoring circuit in some embodiments of the present disclosure.

FIG. 4A is a schematic diagram of the first monitoring circuit 111, the test circuits A11 and the output circuit 114 in some embodiments of the present disclosure. In some embodiments, the output circuit 114 includes multiple shift registers RE1, RE2. Each of the shift registers RE1, RE2 corresponds to ne first monitoring circuit 111, and is configured to store the data output by the first logic circuit 111c. The processing unit 120 determines the corresponding setup time or the corresponding hold time from the data, and stores the setup time or the hold time in multiple fields of a first monitoring table of the processing unit 120. The following is a partial embodiment of the first monitoring table:

|  | Column 1 | Column 2 | Column 3 | Column 4 |
|---|---|---|---|---|
| Row 1 | 12 ps | 30 ps | 6 ps | 20 ps |
| Row 2 | 10 ps | 8 ps | 32 ps | 18 ps |

As shown in above table, the fields in the first monitoring table correspond to the configuration parameters of the test circuits A11 (such as: configuration location). Furthermore, in addition to storing the setup time, the first monitoring table further stores other configuration parameters, such as IR drops, ambient temperature during detection or operations during detection. In the same way, the output circuit 114 can receive the hold time from the second monitoring circuit 112 and store it in the second monitoring table to record as the detection data.

Figure 4B:
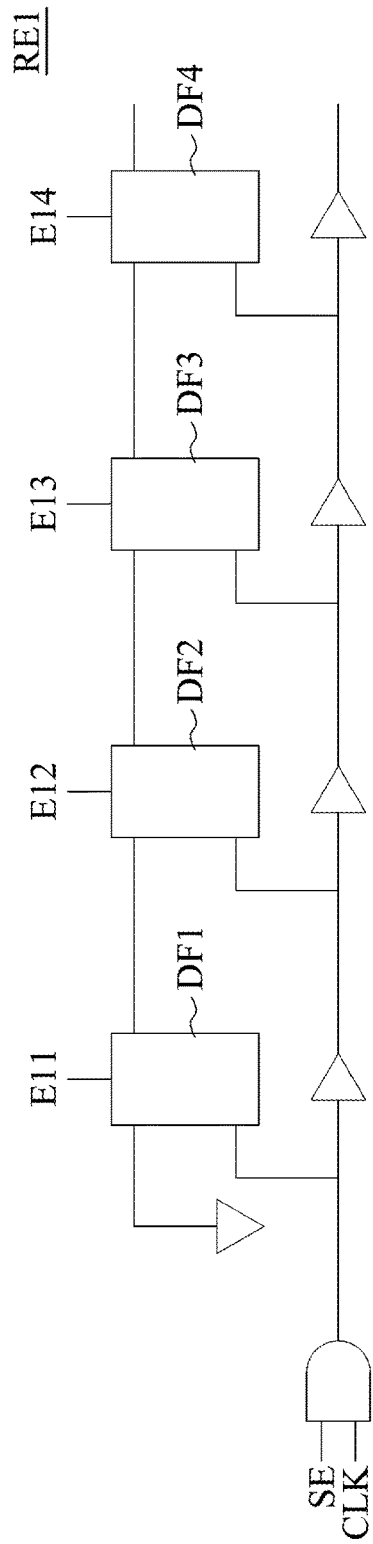
FIG. 4B is a schematic diagram of the shift register in some embodiments of the present disclosure.
Figure 4C:
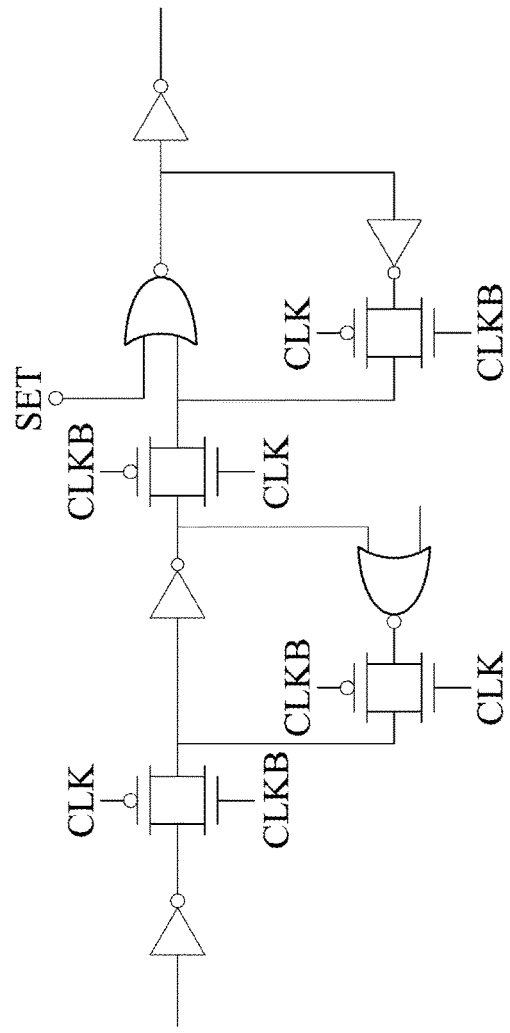
FIG. 4C is a schematic diagram of the register in some embodiments of the present disclosure.

FIG. 4B is a schematic diagram of the shift register RE1 of the output circuit 114 in some embodiments of the present disclosure. The shift registers RE1 includes multiple registers DF1-DF4 (e.g., D type flip-flop). The registers DF1-DF4 perform corresponding operations according to the source clock signal CLK and the external input trigger signal SE (e.g., the processing unit 120 receives a command, or generates according to a trigger program). FIG. 4C is a schematic diagram of one of the registers DF1-DF4 in some embodiments of the present disclosure. The signal level of the conjugate source clock signal CLKB is opposite to the source clock signal CLK, the signal SET is the execution signal in the detection system. Since one skilled in art can understand the operation of each logic element in FIG. 4B and FIG. 4C, it will not be repeated here.

Figure 5A:
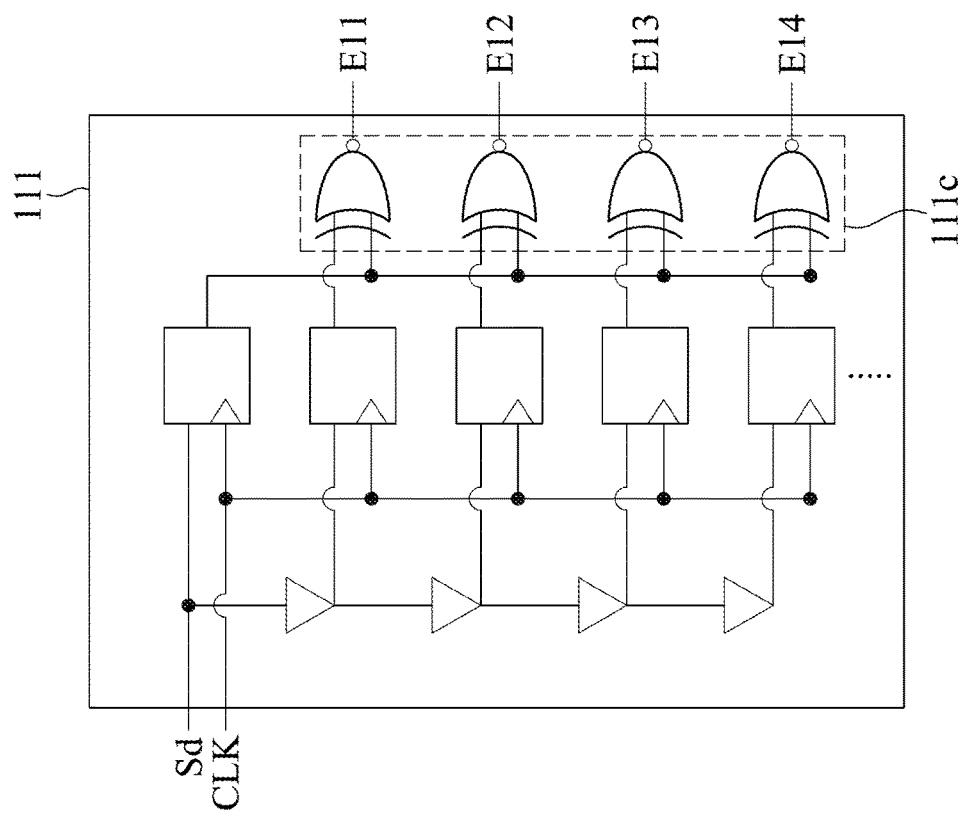
FIG. 5A is a schematic diagram of the first monitoring circuit in some embodiments of the present disclosure.
Figure 5B:
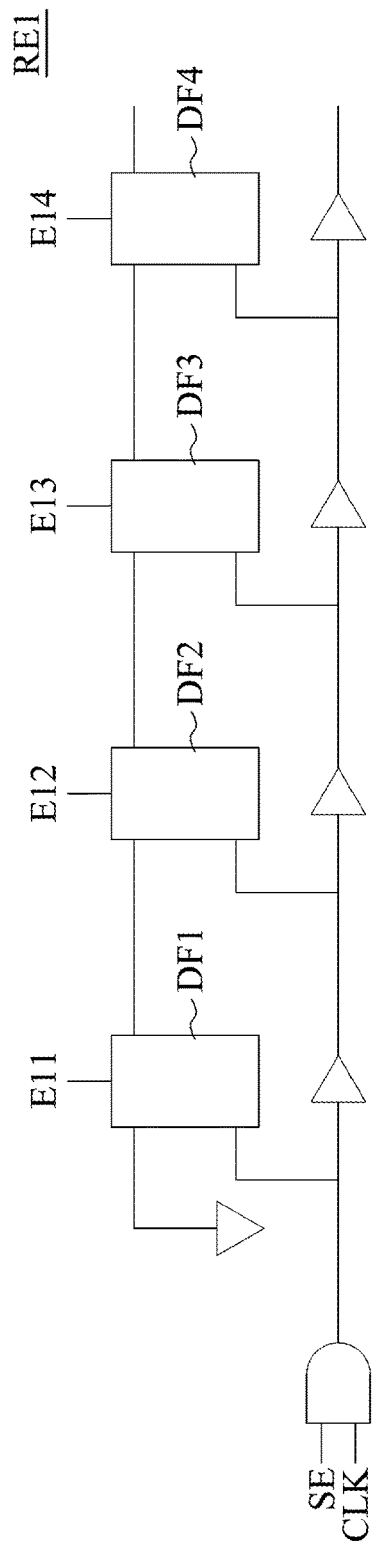
FIG. 5B is a schematic diagram of the shift register in some embodiments of the present disclosure.
Figure 5C:
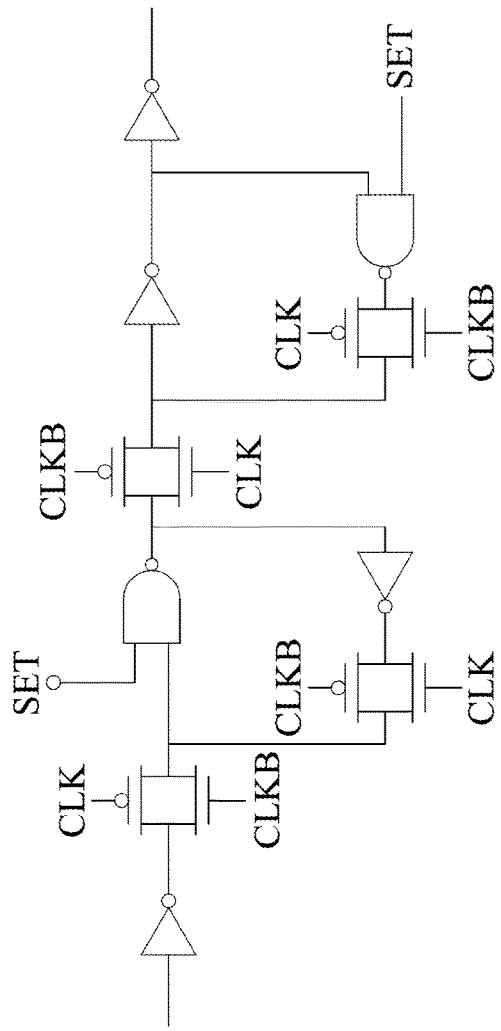
FIG. 5C is a schematic diagram of the register in some embodiments of the present disclosure.

FIG. 5A is a schematic diagram of the first monitoring circuit 111 in some embodiments of the present disclosure. The first logic circuit 111c includes multiple XNOR gates. In the case that the first logic circuit 111c is composed of the XNOR gates, the structure of the shift registers RE1 and the registers DF1-DF4 is shown in FIG. 5B and FIG. 5C. Since the operation of FIG. 5A-FIG. 5C is the same as that of the foregoing embodiment, it will not be repeated here.

Figure 6:
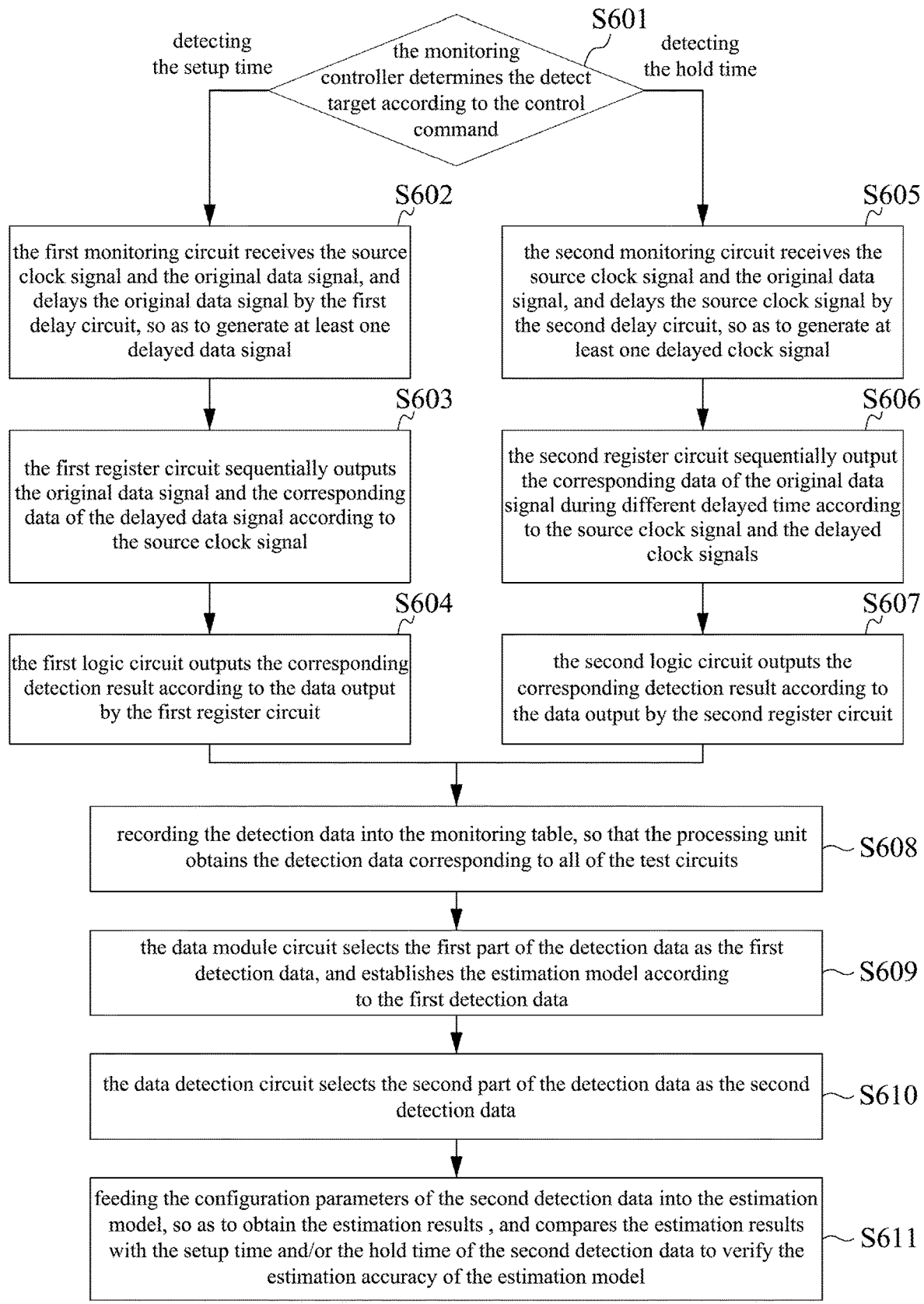
FIG. 6 is a flowchart illustrating a detection method in some embodiments of the present disclosure.

FIG. 6 is a flowchart illustrating a detection method of the detection system 100 in some embodiments of the present disclosure. In step S601, the processing unit 120 transmits the control command Sc to the monitoring controller 113, so that the monitoring unit 110 detect the setup time and the hold time sequentially. The monitoring controller 113 determines the detect target according to the control command Sc.

If the detect target is "the setup time", in step S602, the first monitoring circuit 111 of the monitoring unit 110 receives the source clock signal CLK and the original data signal Sd, and delays the original data signal Sd by the first delay circuit 111b, so as to generate at least one delayed data signal. In this embodiment, the first delay circuit 111b generates multiple delayed data signals Sd1-Sd4.

In step S603, the first register circuit 111a sequentially outputs the original data signal Sd and the corresponding data (high level or low level) of the delayed data signals Sd1-Sd4 according to the source clock signal CLK. In step S604, the first logic circuit 111c outputs the corresponding detection result according to the data output by the first register circuit 111a. The detection result is configured to represent the setup time of the test circuits A11. As shown in FIG. 3A and above embodiments, if the detection result output by the first logic circuit 111c is "1, 1, 0, 0", it represents that the setup time of the test circuits A11 is between 20-30 picoseconds.

If the detect target is "the hold time", in step S605, the second monitoring circuit 112 of the monitoring unit 110 receives the source clock signal CLK and the original data signal Sd, and delays the source clock signal CLK by the second delay circuit 112b, so as to generate at least one delayed clock signal. In this embodiment, the second delay circuit 112b generates multiple delayed clock signals CLK1-CLK4.

In step S606, the second register circuit 112a sequentially output the corresponding data (high level or low level) of the original data signal Sd during different delayed time according to the source clock signal CLK and the delayed clock signals CLK1-CLK4. In step S607, the second logic circuit 112c outputs the corresponding detection result according to the data output by the second register circuit 112. The detection result is configured to represent the hold time of the test circuits A11. As shown in FIG. 3C and above embodiments, if the detection result output by the second logic circuit 112c is "1, 0, 0, 0", it represents that the hold time of the test circuits A11 is bertween 10-20 picoseconds.

After obtaining the detection data of the first monitoring circuit 111 and/or the second monitoring circuit 112, in step S608, the output circuit 114 records the detection data into the first monitoring table and/or the second monitoring table, so that the processing unit 120 obtains the detection data corresponding to all of the test circuits A11.

In step S609, the data module circuit 121 of the processing unit 120 selects the first part of the detection data as the first detection data DT1, and establishes the estimation model DB according to the first detection data DT1.

In step S610, the data detection circuit 122 of the processing unit 120 selects the second part of the detection data as the second detection data DT2. In step S611, the verification circuit 122a feeds the configuration parameters of the second detection data into the estimation model DB, so as to obtain the estimation results, and compares the estimation results with the setup time and/or the hold time of the second detection data DT2 to verify the estimation accuracy of the estimation model DB and obtains the error value.

As mentioned above, if the error value is larger than a predetermine range (or a threshold value), the detection system 100 may adjust or rebuild the estimation model DB. If the error value is within the predetermine range (or the threshold value), the processing unit 120 generates the estimation data of the test circuits according to the estimation model DB. The estimation data may the performance of the test circuits in various situations.(e.g., different configuration parameters or different paths.

The elements, method steps, or technical features in the foregoing embodiments may be combined with each other, and are not limited to the order of the specification description or the order of the drawings in the present disclosure.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. A setup time and hold time detection system, comprising:
    a monitoring unit, electrically coupled to a plurality of test circuits, and configured to detect a plurality of setup times and a plurality of hold times of the plurality of test circuits during signal transmission according to a source clock signal; and
    a processing unit, electrically coupled the monitoring unit, configured to receive the plurality of setup times and the plurality of hold times, and configured to record the plurality of setup times and the plurality of hold times as a plurality of detection data of the plurality of test circuits, wherein the processing unit comprising:
        a data module circuit, configured to select a first part of the detection data as a plurality of first detection data to establish an estimation model, wherein the estimation model is configured to estimate a signal transmission status of the plurality of test circuits under different conditions; and
        a data detection circuit, configured to select a second part of the detection data as a plurality of second detection data, wherein the plurality of second detection data are different from the plurality of first detection data, and are configured to compare with a plurality of estimation results generated by the estimation model to obtain an error value of the estimation model.

2. The setup time and hold time detection system of claim 1, wherein when the error value is larger than a threshold value, the processing unit is configured to select a third part of the detection data to adjust the estimation model, and the third part of the detection data is different from the first part of the detection data.

3. The setup time and hold time detection system of claim 1, wherein the monitoring unit further comprises:
    a first monitoring circuit, configured to detect the plurality of setup times of the plurality of test circuits; and
    a second monitoring circuit, configured to detect the plurality of hold times of the plurality of test circuits;
    wherein the processing unit is configured to record a plurality of configuration parameters of the plurality of test circuits, and is configured to record the plurality of setup times of the plurality of test circuits, the plurality of hold times of the plurality of test circuits and the plurality of configuration parameters as the plurality of detection data.

4. The setup time and hold time detection system of claim 3, wherein the plurality of configuration parameters comprise a plurality of configuration positions, a plurality of IR drops or a plurality of temperatures corresponding to the plurality of test circuits.

5. The setup time and hold time detection system of claim 3, wherein the processing unit is configured to record the plurality of configuration parameters of the plurality of test circuits to a plurality of fields of a monitoring table.

6. The setup time and hold time detection system of claim 3, wherein the processing unit comprises a verification circuit, the verification circuit is configured to feed the plurality of configuration parameters into the estimation model to obtain the plurality of estimation results; and the verification circuit is further configured to compare the plurality of estimation results with the the plurality of setup times and the plurality of hold times corresponding to the plurality of configuration parameters, so as to obtain the error value.

7. The setup time and hold time detection system of claim 3, wherein the first monitoring circuit comprises:
    a first register circuit, configured to receive an original data signal, and output the original data signal according to the source clock signal; and
    a first delay circuit, electrically coupled to the first register circuit, wherein the first delay circuit is configured to delay the original data signal to generate a delayed data signal, and is configured to transmit the delayed data signal to the first register circuit, and the first register circuit outputs the delayed data signal according to the source clock signal.

8. The setup time and hold time detection system of claim 7, wherein the first monitoring circuit further comprises:
    a first logic circuit, electrically coupled to the first register circuit to receive the original data signal and the delayed data signal, wherein the first logic circuit is configured to compare a difference between the original data signal and the delayed data signal.

9. The setup time and hold time detection system of claim 3, wherein the second monitoring circuit comprises:
    a second register circuit, configured to receive an original data signal, and output the original data signal according to the source clock signal during a original time; and
    a second delay circuit, electrically coupled to the second register circuit, wherein the second delay circuit is configured to delay the source clock signal to generate a delayed clock signal, and is configured to transmit the delayed clock signal to the second register circuit, and the second register circuit outputs the original data signal during a delayed time.

10. The setup time and hold time detection system of claim 9, wherein the second monitoring circuit further comprises:
    a second logic circuit, electrically coupled to the second register circuit to receive the original data signal output by the second register circuit, wherein the second logic circuit is configured to compare a difference between the original data signal received at the original time and the original data signal at the delayed time.

11. A setup time and hold time detection method, comprising:
    detecting, by a monitoring unit, a plurality of setup times of a plurality of test circuits and a plurality of hold times of the plurality of test circuits during signal transmission;

recording the plurality of setup times and the plurality of hold times as a plurality of detection data of the plurality of test circuits;

selecting a first part of the detection data as a plurality of first detection data, and establishing an estimation model according to the plurality of first detection data;

selecting a second part of the detection data as a plurality of second detection data, wherein the plurality of second detection data are different from the plurality of first detection data; and comparing the plurality of second detection data with a plurality of estimation results generated by the estimation model to obtain an error value of the estimation model.

12. The setup time and hold time detection method of claim 11, further comprising:

when the error value is larger than a threshold value, selecting a third part of the detection data to adjust the estimation model, wherein the third part of the detection data is different from the first part of the detection data.

13. The setup time and hold time detection method of claim 11, further comprising:

recording a plurality of configuration parameters of the plurality of test circuits; and recording the plurality of setup times of the plurality of test circuits, the plurality of hold times of the plurality of test circuits and the plurality of configuration parameters as the plurality of detection data.

14. The setup time and hold time detection method of claim 13, wherein the plurality of configuration parameters comprise a plurality of configuration positions, a plurality of IR drops or a plurality of temperatures corresponding to the plurality of test circuits.

15. The setup time and hold time detection method of claim 13, wherein recording the plurality of configuration parameters of the plurality of test circuits comprises:

storing the plurality of setup times and the plurality of hold times of the plurality of test circuits to a plurality of fields of a monitoring table to record the plurality of configuration parameters corresponding to the plurality of test circuits.

16. The setup time and hold time detection method of claim 13, wherein comparing the plurality of second detection data with the plurality of estimation results generated by the estimation model to obtain the error value of the estimation model comprises:

feeding, by a verification circuit, the plurality of configuration parameters into the estimation model to obtain the plurality of estimation results; and comparing the plurality of estimation results with the the plurality of setup times and the plurality of hold times corresponding to the plurality of configuration parameters, so as to obtain the error value.

17. The setup time and hold time detection method of claim 11, wherein detecting the plurality of setup times and the plurality of hold times of the plurality of test circuits during signal transmission comprises:

receiving an original data signal by a first register circuit;

outputting the original data signal according to a source clock signal;

delaying, by a first delay circuit, the original data signal to generate a delayed data signal; and transmitting the delayed data signal to the first register circuit, and outputting the delayed data signal according to the source clock signal by the first register circuit.

18. The setup time and hold time detection method of claim 17, wherein detecting the plurality of setup times and the plurality of hold times of the plurality of test circuits during signal transmission further comprises:

receiving the original data signal and the delayed data signal by a first logic circuit; and comparing a difference between the original data signal and the delayed data signal.

19. The setup time and hold time detection method of claim 11, wherein detecting the plurality of setup times and the plurality of hold times of the plurality of test circuits during signal transmission comprises:

receiving an original data signal by a second register circuit;

outputting the original data signal according to the source clock signal during a original time;

delaying, by a second delay circuit, the source clock signal to generate a delayed clock signal; and transmitting the delayed clock signal to the second register circuit, and outputting the original data signal during a delayed time by the second register circuit.

20. The setup time and hold time detection method of claim 19, wherein detecting the plurality of setup times and the plurality of hold times of the plurality of test circuits during signal transmission further comprises:

receiving, by a second logic circuit, the original data signal output by the second register circuit; and comparing a difference between the original data signal received at the original time and the original data signal at the delayed time.

* * * * *